United States Patent [19]

Narabu et al.

[11] Patent Number: 5,210,777
[45] Date of Patent: May 11, 1993

[54] CHARGE COUPLED DEVICE HAVING SWITCHED INVERTING AND NON-INVERTING INPUT SIGNAL PATHS, INPUT BIASSING CIRCUIT AND TEMPERATURE COMPENSATION

[75] Inventors: Tadakuni Narabu; Tetsuya Kondo; Yasuhito Maki; Katsunori Noguchi, all of Kanagawa, Japan

[73] Assignee: Sony Corporation, Japan

[21] Appl. No.: 509,205

[22] Filed: Apr. 16, 1990

[30] Foreign Application Priority Data

Apr. 17, 1989 [JP] Japan ................... 1-97208
Apr. 17, 1989 [JP] Japan ................... 1-97209

[51] Int. Cl.$^5$ .................... G11C 27/04; G11C 19/28
[52] U.S. Cl. ........................ 377/60; 377/58; 377/63; 307/607; 257/215
[58] Field of Search ................... 377/57–63; 357/24; 307/607, 591, 597, 310, 296.1; 328/55

[56] References Cited

U.S. PATENT DOCUMENTS

| | | | |
|---|---|---|---|
| 3,819,954 | 6/1974 | Butler et al. | 377/58 |
| 3,991,322 | 11/1976 | Bush et al. | 307/607 |
| 4,136,287 | 1/1979 | Kephart et al. | 377/58 |
| 4,139,784 | 2/1979 | Saner | 357/24 |
| 4,156,818 | 5/1979 | Collins et al. | 377/63 |
| 4,200,810 | 4/1980 | Cain et al. | 307/607 |
| 4,307,423 | 12/1981 | Atherton | 358/213 |
| 4,330,753 | 5/1982 | Davy | 377/60 |
| 4,469,082 | 9/1984 | Nishitoba et al. | 307/310 |
| 4,532,541 | 7/1985 | Cooper | 307/607 |
| 4,610,019 | 9/1986 | Richards et al. | 377/60 |
| 4,625,322 | 11/1986 | Tukazaki et al. | 357/24 |
| 4,876,703 | 10/1989 | Uzata et al. | 377/62 |
| 4,967,110 | 10/1990 | Matsuura | 328/55 |

FOREIGN PATENT DOCUMENTS

| | | | |
|---|---|---|---|
| 0147697 | 10/1985 | European Pat. Off. | |
| 0211441 | 2/1987 | European Pat. Off. | |
| 0121198 | 7/1983 | Japan | 377/57 |
| 0088864 | 4/1988 | Japan | 377/60 |

Primary Examiner—Andrew J. James
Assistant Examiner—Tai V. Duong
Attorney, Agent, or Firm—Ronald P. Kananen

[57] ABSTRACT

A charge coupled device is provided with a first signal input path for supplying an information signal for transfer through a delay line, which contain an inverting amplifier, and a second signal input path which has no inverting amplifier. The first and second signal input paths are arranged in parallel to each other. The charge coupled device also has a switching means associated with the first and second signal input paths so as to selectively establishing connection between one of the first and second signal input paths and the delay line so that non-inverted and inverted information signals can be selectively supplied to the delay line.

14 Claims, 3 Drawing Sheets

CHARGE COUPLED DEVICE HAVING SWITCHED INVERTING AND NON-INVERTING INPUT SIGNAL PATHS, INPUT BIASSING CIRCUIT AND TEMPERATURE COMPENSATION

BACKGROUND OF THE INVENTION

1. Field of the Invention

The present invention relates generally to a charge coupled device (CCD). More particularly, the invention relates to a gate input system for a CCD which can switch the signal phase relationship between the input signal and output signal.

2. Description of the Background Art

The CCD has typically been used as signal delay element. Particularly, in the modern video signal processing technology, it has become necessary to use the CCD for a delay element in comb filters. Namely, in the prior art, the glass delay line has been used for forming a delay element in the comb filter. The glass delay element converts a signal into an acoustic wave for passage through a glass layer. Such a glass delay element, however, is limited by the reduction of the size and by the lowering of production cost. Furthermore, the glass delay element cannot successfully follow the trend in the video technology to use higher band. Due to such defects in the glass delay element, the CCD is considered as the replacement for the glass delay element.

In the video technology, the current trend is to make video equipments, such as a video camera, a video tape recorder and so forth, portable. Reduction in the video equipments size creates a need for operation at a lower power source voltage. In order to answer to this need, it becomes necessary to drive the CCD with a sole power source of relatively low voltage, e.g. 5 V. This leads to a difficulty in obtaining satisfactory high linearity in the input/output characteristics in a diode cut-off input system for applying the input signal to a source region of the CCD. For this reason, the needs for the gate input system increases.

In the gate input system, signal phases of the input signal and the output signal are necessarily reversed. For preventing this, an inverting amplifier is provided for the input or output circuit of the CCD. If the inverting amplifier is provided in the output circuit, it has to amplify the signal already amplified by the output amplifier. This may require wider dynamic range for the inverting amplifier. In view of this, it is preferred to provide the inverting amplifier in the input circuit.

When the inverting amplifier in the CCD provides the input and output signals in phase, the temperature characteristics of the CCD can be degraded. Particularly, the presence of the inverting amplifier can increase the temperature dependency of the delay magnitude for the signal. Fluctuations in the delay magnitude may affect characteristics of the comb filter. Because of this, two different requirements arise from customers. One is to permit degradation of the temperature characteristics in order to obtain coincident phases of input and output signals. The other is to prevent degradation of the temperature characteristics but permit difference in the signal phases of the input and output signals. It is not practical, however, to produce different types of CCD's in the viewpoint of manufacturing efficiency and cost. Therefore, it is preferred to produce a CCD which can answer both requirements.

On the other hand, the input bias for the delay line is variable depending upon the phase relationship between the input signal and the output signal. Therefore, it is preferred to provide the capability the switching of input bias level between different levels.

SUMMARY OF THE INVENTION

Therefore, it is an object of the present invention to provide a charge coupled device which has the capability of switching phase relationships of the input and output signals.

Another object of the present invention is to provide a charge coupled device which can vary the input bias level.

In order to accomplish the aforementioned objects, a charge coupled device, according to the present invention, is provided a first signal input path for supplying an information signal to be transferred through a delay line, in which is connected an inverting amplifier, and a second signal input path having no inverting amplifier. The first and second signal input paths are arranged in parallel to each other. The charge coupled device also has a switching means associated with the first and second signal input paths so as to selectively establishing connection between one of first and second signal input paths and the delay line so that non-inverted and inverted information signal can be selectively supplied to the delay line.

According to one aspect of the invention, a charge coupled device comprises:

a delay line having an input and an output;

an information signal source for supplying an information signal;

a first input circuit directly connecting the information signal source to the delay line;

a second input circuit connecting the information signal source to the delay line via an inverting amplifier; and a switching means associated with the first and second input for selectively establishing and blocking electrical communication between the information signal source and the delay line so that the information signal source is communicated with the delay line via one of the first and second input circuits.

The switching means may comprise a first switch element disposed in the first input circuit and switchable between a conductive state and non-conductive state, a second switch element disposed in the second input circuit and switchable between a conductive state and non-conductive state, the first and second switch elements being responsive to a control signal level in opposite fashion to each other so that when one of the first or second switch element is in a conductive state, the other is in non-conductive state. The level of the control signal is set for operating the second switch element into a conductive state when the same signal phase of information signal at the input and output of the delay line is required.

The charge coupled device may further comprise an input bias point setting means which comprises a first setting circuit for setting an input bias at a first bias point, a second setting circuit for setting the input bias at a second bias point different from the first bias point, and a bias switching means for selectively connecting one of the first and second setting circuit to the information signal source. In such case, the switch means is operated by a bias switching signal level which is variable depending upon the phase relationship of the information signal at the input and the output of the delay line.

Also, the charge coupled device may further comprise a sampling pulse generator for generating a sampling pulse defining sampling timing at the input and output of the delay line, the sampling pulse generator being provided with a capability of adjusting the duty cycle of the sampling pulse for compensating temperature dependent error of delay period. The output of the delay line may include an output buffer having a temperature dependent delay characteristics, and the sampling pulse generator includes a delay element having temperature dependent delay characteristics equivalent to that of the output buffer for making an automatic adjustment of the duty cycle of the sampling pulse dependent upon temperature condition.

According to another aspect of the invention, a charge coupled device comprises:
 a delay line having an input and output;
 an information signal source for supplying an information signal;
 an input circuit connecting the information signal source to the delay line;
 a sampling pulse generator for generating a sampling pulse defining sampling timing at the input and output of the delay line, the sampling pulse generator being provided with a capability of adjusting the of adjustment duty cycle of the sampling pulse for the compensating temperature dependent error of delay period.

According to a further aspect of the invention, a charge coupled device comprises:
 a delay line having an input and output;
 an information signal source for supplying an information signal;
 a first input circuit directly connecting the information signal source to the delay line;
 a second input circuit connecting the information signal source to the delay line via an inverting amplifier;
 a switching means associated with the first and second input, for selectively establishing and blocking electrical communication between the information signal source and the delay line so that the information signal source is communicated with the delay line via one of the first and second input circuits; and
 a sampling pulse generator for generating a sampling pulse defining sampling timing at the input and output of the delay line, the sampling pulse generator being provided with a capability of adjusting the duty cycle of the sampling pulse for compensating temperature dependent error of delay period.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiment but are for explanation and understanding only.

In the drawings.

DESCRIPTION OF THE PREFERRED EMBODIMENT

Figure 1:
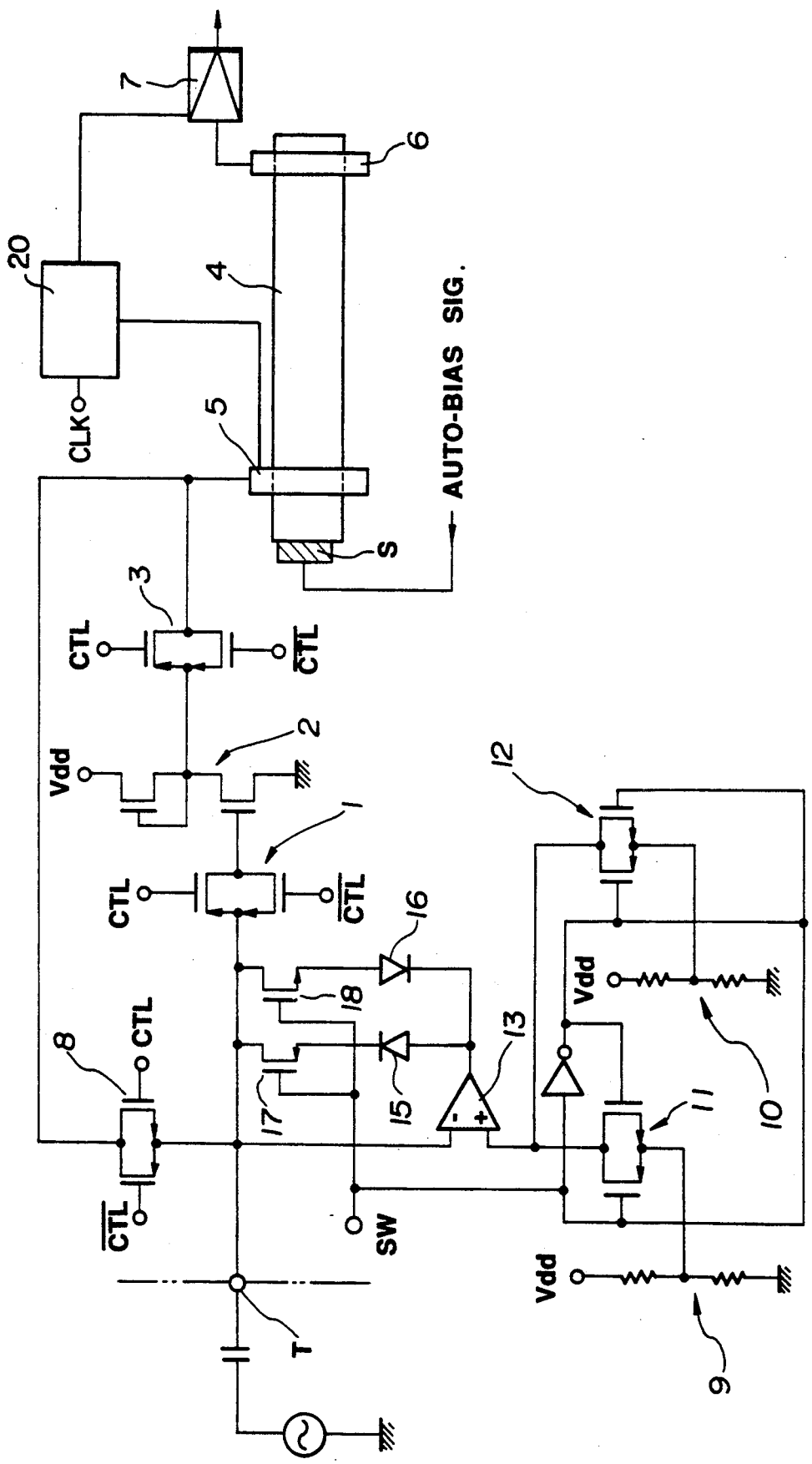
FIG. 1 is a circuit diagram of the preferred embodiment of a charge coupled device, according to the present invention, which has an improved signal input circuit construction.

Referring now to the drawings, particularly to FIG. 1, the preferred embodiment of a charge coupled device (CCD) is associated with an automatic bias system for automatically adjusting the input bias level. Such automatic bias system is known in the art and has been disclosed in U.S. Pat. No. 4,625,322, issued on Nov. 25, 1986, to Tukazaki et al., U.S. Pat. No. 4,139,784 issued on Feb. 13, 1979, to Sauer, and European Patent First Publication 01 47 697 published on Jul. 10, 1985, for example. The disclosure of these inventions will be herein incorporated by reference for the sake of disclosure.

Figure 3:
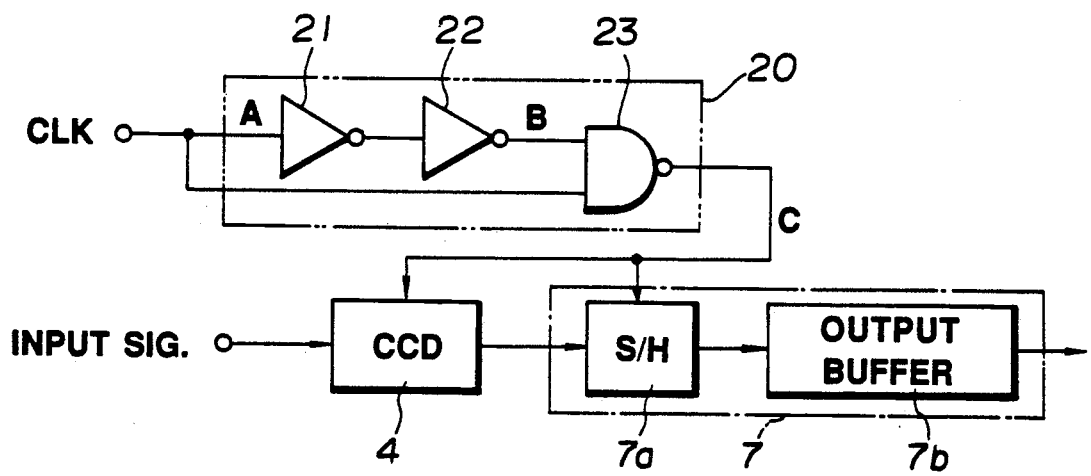
FIG. 3 is a schematic block diagram of the output circuit structure applicable for the shown embodiment of the charge coupled device of FIG. 1.

As shown in FIG. 1, the shown embodiment of the charge coupled device has an input terminal T externally connected to an information signal source I. The input terminal T is connected to an input gate 5 of a CCD delay line 4 via an inverting amplifier 2. A CMOS switch 1 is provided between the input terminal T and the inverting amplifier 2 for selectively establishing and blocking electrical communication therebetween. Another CMOS switch 3 is disposed between the inverting amplifier 2 and the input gate 5. The information signal transferred through the delay line 4 is output through an output gate 6 and an output circuit 7. As shown in FIG. 3, the output circuit 7 comprises a sample/hold circuit 7a and an output buffer 7b. The CCD delay line 4 has a source region S, to which an automatic bias signal from the aforementioned automatic bias system is applied for automatically adjusting the input bias level.

A by-pass path by-passing the inverting amplifier 2 is provided for direct connection between the input terminal T to the input gate 5. A CMOS switch 8 is disposed in the path for selectively establishing or blocking electrical communication between the input terminal T and the input gate 5.

A bias level setting circuit is also provided in this embodiment of the CCD for adjusting an input bias level. The bias level setting circuit includes a voltage divider 9 for setting a clamp level. The clamp levels set by voltage dividers 9 and 10 are mutually different from each other. The outputs of the voltage dividers 9 and 10 are connected to the non-inverting input terminal of a differential amplifier 13 via CMOS switches 11 and 12. The inverting input terminal of the differential amplifier 13 is connected to the input terminal T. The output terminal of the differential amplifier 13 is connected to the anode of a diode 15 and to the cathode of a diode 16. The cathode of the diode 15 is connected to the input terminal T via a p-channel MOS transistor 17. On the other hand, the anode of the diode 16 is connected to the input terminal T via a n-channel MOS transistor 18.

The CMOS switches 1, 3 and 8 are controlled by control signal CTL and inverted control signal $\overline{CTL}$. In the shown embodiment, when the control signal CTL is HIGH level, the CMOS switch 8 becomes conductive to establish direct communication between the input terminal T and the input gate 5 via the by-pass path. The CMOS switches 1 and 3 are then held non-conductive to block electrical communication therethrough. On the other hand, when the inverted control signal $\overline{CTL}$ is HIGH level, the CMOS switches 1 and 3 are conductive to establish communication between the input terminal T and the input gate 5 across the inverting amplifier 2.

On the other hand, the MOS transistors 17 and 18 and the CMOS switches 11 and 12 are switched by a bias level switching signal SW and the inverted bias level switching signal. Practically, the CMOS switch 11 and the p-channel transistor 17 are conductive under the presence of a HIGH level inverted bias level switching signal. At this time, the bias level is set at a level by the voltage divider 9. On the other hand, when the bias switching signal SW is at a HIGH level, the COMS switch 12 and the n-channel transistor 18 are conductive for setting the bias level at a level set by the voltage divider 10.

Figure 2:
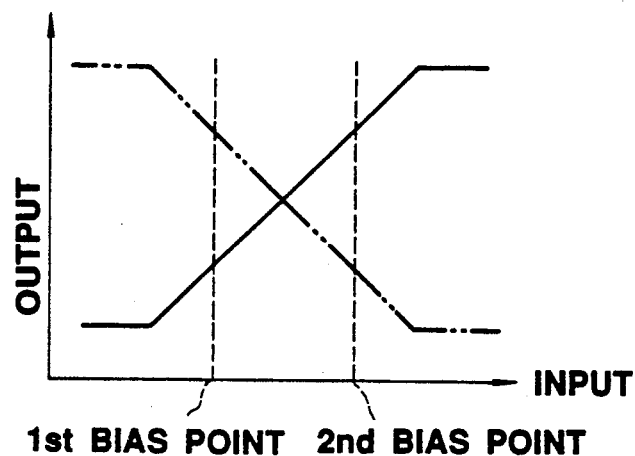
FIG. 2 is a chart showing input/output characteristics in the shown embodiment of the charge coupled device of FIG. 1.

With the construction set forth above, the CCD is provided with the input/output characteristics as illustrated in FIG. 2. In FIG. 2, the input/output characteristics for when the inverting amplifier 2 is active provides a phase relationship in which the signal phases of the input signal and the output signal are the same as shown by the solid line. On the other hand, the input/output characteristics for when the inverting amplifier 2 is not active provides different signal phases in the input and output signals, as shown by the two-dotted line. In addition, as can be seen, the shown embodiment may provide two mutually different bias levels.

The first bias point is selected when both of the input and output signals are in positive phase. Also, the first bias point is selected when the input signal is in positive phase and the output signal is in the negative phase. On the other hand, when both of the input and output signals are in negative phase, the second bias point is selected. Also, when the input signal is in negative phase and the output signal is in positive phase, the second bias point is selected.

As can be appreciated herefrom, according to the shown embodiment, phase relationships between the input and output signals can be selected simply by the control signal level. Furthermore, according to the shown embodiment, the input bias point can be selected by the bias level setting circuit.

As set out in the introduction of the disclosure, presence of the inverted amplifier for obtaining the same phase of the input and output signals, may cause variation of the delay magnitude in the delay line depending upon temperature conditions. It is of course preferred to compensate for fluctuations in the delay magnitude. For satisfactorily compensation of the temperature dependent characteristics of the CCD, the shown embodiment employs a sampling timing control at the input and output. To compensate for the temperature dependent fluctuations in the delay magnitude, a sampling pulse generator circuit 20 is connected to a clock generator for receiving a clock pulse CLK. The sampling pulse generator circuit 20 comprises a pair of inverters 21 and 22 which form a delay circuit and a NAND gate 23. The sampling pulse generator circuit 20 outputs a sampling pulse which serves as an input sampling pulse for the CCD delay line 4 and as an output sampling pulse for a sample/hold circuit 24 in the output circuit 7. Practically, the sampling of the input signal is performed in response to the trailing edge of the sampling pulse and sampling of the output signal is performed in response to the leading edge of the sampling pulse.

Here, the output buffer 7b is constituted by FETs which have a variable conductance gm depending upon the temperature condition. Namely, the conductance gm of an FET is lowered with a rising temperature. Therefore, the delay time $T_p$ of the output buffer 7b increases with a rising temperature. This can be compensated by shortening the interval between the input sampling timing and the output sampling timing. In order to realize this, the sampling pulse width has to be expanded.

Figure 4:
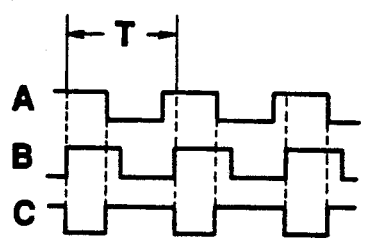
FIG. 4 is a timing chart showing operation of a sampling pulse generator circuit employed in the output circuit of FIG. 3.
Figure 5:
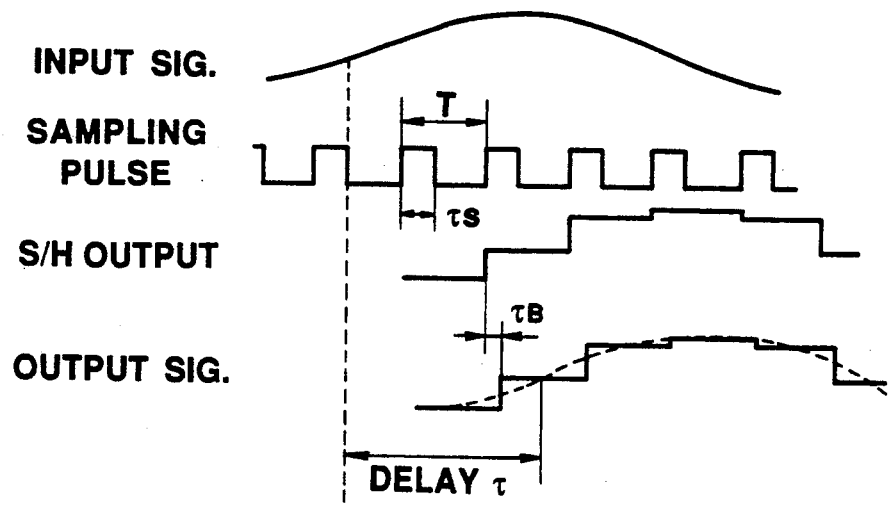
FIG. 5 is a timing chart showing operation of the output circuit of FIG. 3.

According to the shown embodiment, adjustment of the sampling pulse width with temperature can be done automatically by the sampling pulse generator circuit 20. Namely, the NAND gate 23 has one input terminal in which the clock pulse CLK, as illustrated by A in FIGS. 3 and 4, is directly applied. On the other hand, a pulse delayed by the inverters 21 and 22, as shown by B, is applied to the other input terminal of the NAND gate 23. By this, the sampling pulse as illustrated by C is output from the NAND gate 23. Assuming the duty cycle of the clock pulse CLK is 50% and further assuming the delay in the inverters 21 and 22 is zero, the duty cycle of the sampling pulse becomes 50%. Delays in the inverters 21 and 22 may cause the duty cycle of the sampling pulse to increase above 50%. Since the inverters 21 and 22 are influenced by the same temperature condition as that caused in the output buffer, the sampling pulse width can be adjusted automatically with the temperature. Therefore, as shown in FIG. 5, the delay time $\tau$ can be adjusted by the pulse width $\tau_s$ of the input/output sampling pulse, variation of which causes a variation in the duty cycle of the sampling pulse in relation to the constant pulse period T. In FIG. 5, $\tau_B$ represents the delay time caused by group delay in the output buffer.

Figure 6:
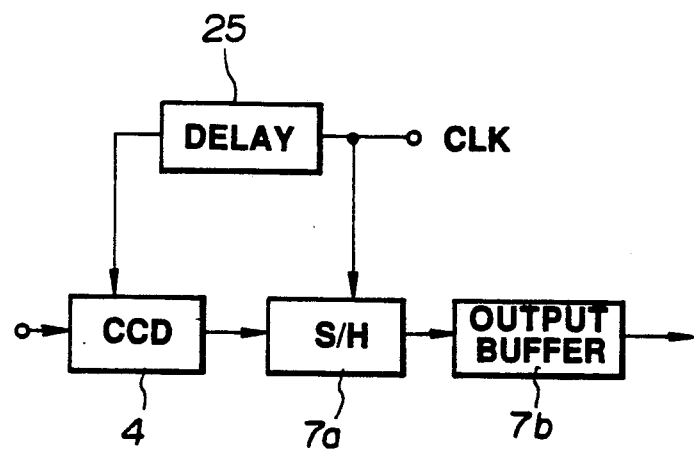
FIG. 6 is a block diagram of another embodiment of output circuit structure applicable for the charge coupled device of FIG. 1.

FIG. 6 shows another embodiment of input and output sampling timing control circuit to be employed in the preferred embodiment of the CCD. In this embodiment, the clock pulse CLK is directly applied to the sample/hold circuit 7a and is applied to the CCD delay line via a delay circuit 25. The delay circuit 25 may be provided with temperature dependent characteristics to increase the delay magnitude according to a rise in temperature. With this circuit construction, substantially equivalent compensation for fluctuating in delay magnitude to the former embodiment can be achieved.

While the present invention has been disclosed in terms of the preferred embodiment in order to facilitate better understanding of the invention, it should be appreciated that the invention can be embodied in various ways without departing from the principles of the invention. Therefore, the invention should be understood to include all possible embodiments and modifications to the shown embodiments which can be embodied without departing from the principles of the invention set out in the appended claims.

What is claimed is:

1. A control circuit for a charge coupled device (CCD) comprising:
   (a) a CCD delay line having an input and an output;

(b) an input signal source for supplying an input signal;

(c) a first input circuit connected to said input signal source and to the input of said CCD delay line;

(d) a second input circuit connected to said input signal source and to the input of said CCD delay line via an inverting amplifier;

(e) said first and second circuits each including a switching means for selectively connecting said input signal source to said CCD delay line via one of said first and second input circuits and disconnecting said input signal source to said CCD delay line via the other of said first and second input circuits; and (f) an input bias point setting means consisting of a first setting circuit for setting an input bias for said CCD delay line at a first bias point, a second setting circuit for setting said input bias at a second bias point different from said first bias point, and bias switching means for selectively connecting one of said first and second setting circuits to said input signal source.

2. A control circuit for a charge coupled device as set forth in claim 1, wherein said switching means comprises a first switch element disposed in said first input circuit, second switch elements disposed in said second input circuit, said first and second switch elements are switchable between a conductive state and a non-conductive state, said first and second switch elements being responsive to a control signal level in opposite fashion to each other so that when one of said first and second switch elements is in said conductive state, the other is in said non-conductive state.

3. A control circuit for a charge coupled device as set forth in claim 2, wherein the level of said control signal is set for operating said second switch elements into said conductive state for causing the phase of an input signal at said input and the phase of an output signal at the output of said CCD delay line to be equal to each other.

4. A control circuit for a charge coupled device as set forth in claim 1, wherein said bias switching means is operated by a bias switching signal level which varies depending upon a desired phase relationship between said input signal at said input and an output signal at said output of said CCD delay line.

5. A control circuit for a charge coupled device as set forth in claim 1, which further comprises a sampling pulse generator coupled to said input and said output of said CCD delay line for generating a sampling pulse which defines a sampling timing at said input and said output of said CCD delay line, said sampling pulse generator including means for adjusting a duty cycle of said sampling pulse to compensate for a temperature dependent error in a delay period of said CCD delay line.

6. A control circuit for a charge coupled device as set forth in claim 5, wherein said output of said CCD delay line includes an output buffer having a temperature dependent delay characteristic, and said sampling pulse generator includes delay elements having a temperature dependent delay characteristic equivalent to that of said output buffer whereby an automatic adjustment of the duty cycle of said sampling pulse is made according to a temperature condition.

7. A control circuit for a charge coupled device (CCD) comprising:

(a) a CCD delay line having an input and an output;

(b) an input signal source for supplying an input signal;

(c) an input circuit for selectively supplying inverted or non-inverted said input signal to said input of said CCD delay line;

(d) a sampling pulse generator coupled to said input and said output of said CCD delay line for generating an input sampling pulse which is supplied to said input and an output sampling pulse which is supplied to said output of said CCD delay line, said input sampling pulse and said output sampling pulse defining a sampling time at said input and said output of said CCD delay line; and (e) said sampling pulse generator including means for adjusting a delay of said input sampling pulse with respect to said output sampling pulse to compensate for a temperature dependent error in a delay period of said CCD delay line.

8. A control circuit for a charge coupled device as set forth in claim 7, wherein said output of said delay line includes an output buffer having a temperature dependent delay characteristic, and said sampling pulse generator includes a delay element having a temperature dependent delay characteristic equivalent to that of said output buffer whereby an automatic adjustment of the delay of said input sampling pulse is made according to the temperature condition.

9. A control circuit for a charge coupled device comprising:

a CCD delay line having an input and an output;
an information signal source for supplying an input information signal;
a first input circuit directly connecting said information signal source to said CCD delay line;
a second input circuit connecting said information signal source to said CCD delay line via an inverting amplifier;
said first and second input circuits each including a switching means for selectively connecting said information signal source to said CCD delay line via one of said first and second input circuits and disconnecting said information signal source to said CCD delay line via the other of said first and second input circuits; and
a sampling pulse generator connected to said input and said output of said CCD delay line for generating a sampling pulse which defines a sampling timing at said input and said output of said CCD delay line, said sampling pulse generator including means for adjusting a duty cycle of said sampling pulse for compensating a temperature dependent error in a delay period of said CCD delay line.

10. A control circuit for a charge coupled device as set forth in claim 9, wherein said switching means comprises a first switch element disposed in said first input circuit, second switch elements disposed in said second input circuit, said first and second switch elements are switchable between a conductive state and a non-conductive state, said first and second switch elements being responsive to a control signal level in opposite fashion to each other so that when one of said first and second switch element is in said conductive state, the other is in said non-conductive state.

11. A control circuit for a charge coupled device as set forth in claim 10, wherein a level of said control signal is set for operating said second switch elements into said conductive state for causing the phase of said information signal at said input and the phase of an output signal at the output of said CCD delay line to be equal to each other.

12. A control circuit for a charge coupled device as set forth in claim 9, which further includes an input bias point setting means which comprises a first setting circuit for setting an input bias for said CCD delay line at a first bias point, a second setting circuit for setting the input bias at a second bias point different from said first bias point, and a bias switching means for selectively connecting one of said first and second setting circuits to said information signal source.

13. A control circuit for a charge coupled device as set forth in claim 12, wherein said bias switching means is operated by a bias switching signal level which varies depending upon a desired phase relationship between said information signal at said input and said output signal at the output of said CCD delay line.

14. A control circuit for a charge coupled device as set forth in claim 9, wherein said output of said CCD delay line includes an output buffer having a temperature dependent delay characteristic, and said sampling pulse generator includes delay elements having a temperature dependent delay characteristic equivalent to that of said output buffer whereby an automatic adjustment of the duty cycle of said sampling pulse is made according to a temperature condition.

* * * * *